United States Patent [19]

Heilbronner et al.

[11] Patent Number: 5,296,739
[45] Date of Patent: Mar. 22, 1994

[54] CIRCUIT ARRANGEMENT WITH A COOLING MEMBER

[75] Inventors: Heinrich Heilbronner, Stein; Werner Tursky, Schwabach; Christian Goebl; Thomas Frank, both of Nürnberg, all of Fed. Rep. of Germany

[73] Assignee: Export-Contor Aussenhandelsgesellschaft mbH, Nürnberg, Fed. Rep. of Germany

[21] Appl. No.: 861,186

[22] Filed: Mar. 31, 1992

[30] Foreign Application Priority Data

Apr. 8, 1991 [DE] Fed. Rep. of Germany ....... 4111247
Jul. 6, 1991 [DE] Fed. Rep. of Germany ....... 4122428

[51] Int. Cl.$^5$ ...................... H01L 23/02; H01L 23/12
[52] U.S. Cl. ..................................... 257/687; 257/706; 257/717; 257/718; 165/80.2; 174/16.3; 361/704; 361/705; 361/714
[58] Field of Search ............... 257/687, 717, 718, 719, 257/682, 706, 707, 796; 361/386, 387, 389; 165/80.2; 174/16.3

[56] References Cited

U.S. PATENT DOCUMENTS

| | | | |
|---|---|---|---|
| 4,069,498 | 1/1978 | Joshi | 257/707 |
| 4,092,697 | 5/1978 | Spaight | 257/706 |
| 4,153,107 | 5/1979 | Antonetti et al. | 257/719 |
| 4,396,936 | 8/1983 | McIver et al. | 257/717 |
| 4,621,304 | 11/1986 | Oogaki et al. | 361/386 |
| 4,709,301 | 11/1987 | Yamaguti | 361/387 |
| 4,768,081 | 8/1988 | Moeller | 257/682 |
| 4,849,856 | 7/1989 | Funari et al. | 257/717 |
| 4,914,551 | 4/1990 | Anschel et al. | 257/717 |
| 5,014,777 | 5/1991 | Sano | 257/718 |
| 5,184,211 | 2/1993 | Fox | 257/718 |

FOREIGN PATENT DOCUMENTS

| | | |
|---|---|---|
| 2942401 | 4/1981 | Fed. Rep. of Germany . |
| 3521572 | 12/1986 | Fed. Rep. of Germany . |
| 3508456 | 1/1987 | Fed. Rep. of Germany . |
| 3628556 | 4/1988 | Fed. Rep. of Germany . |
| 0226952 | 9/1988 | Japan . |
| 0310566 | 12/1989 | Japan . |

OTHER PUBLICATIONS

R. C. Chu, 'Conduction Path for Elect. Comp.', IBM Tech Dis. Bull., vol. 19, No. 11, Apr. 1977, p. 4279.
R. C. Chu, 'Design for Providing Thermal Interface Material', IBM Tech Dis. Bull., vol. 20, No. 7, Dec. 1977, pp. 2761–2762.
Gupta and Holt, 'Air–Cooled Module with Conformal Inner Fin', IBM Tech. Dis. Bull., vol. 23, No. 10, Mar. 1981, pp. 4397–4399.
Darrow et al, 'Stack Structure for Mixed Tech. Thermal Enhancement', IBM Tech. Dis. Bull., vol. 22, No. 3, Aug. 1979, pp. 958–959.

Primary Examiner—Rolf Hille
Assistant Examiner—David Ostrowski
Attorney, Agent, or Firm—Horst M. Kasper

[57] ABSTRACT

The circuit arrangement comprises a mounting plate carrying at least one preferably chip-form component and contact surfaces electrically conductively connected to the component by connecting elements. The mounting plate is carried on a cooling member and is pressed thereagainst by a pressing arrangement. The pressing arrangement has a mounting element, with an elastically yielding cushion element on the side which is towards the cooling member, to press against the electrical component and/or in the vicinity thereof against the mounting plate in electrically insulated relationship therewith.

22 Claims, 4 Drawing Sheets

CIRCUIT ARRANGEMENT WITH A COOLING MEMBER

BACKGROUND OF THE INVENTION

A circuit arrangement which includes at least one component in chip form, which requires cooling, as is disclosed for example in DE 35 08 456 C2, has at least one mounting plate on which the at least one chip-form component to be cooled is disposed. The mounting plate also carries contact surfaces which are connected by means of suitable connecting elements to the respective chip-form component. The mounting plate is disposed on a cooling member, and a pressing arrangement is operable to press the mounting plate against the cooling member. The mounting plate on which the chip-form component is disposed is glued into a housing and the pressing arrangement is formed by adjusting screws and intermediate portions. The adjusting screws are screwed through reinforcement portions of the housing. With such a design configuration, in particular when the circuit arrangement is subjected to a thermal loading which occurs over a prolonged period of time, it is not possible reliably to guarantee that the contact pressure of the pressing arrangement is maintained constant because the plastic material constituting the housing may suffer from a yield phenomenon, caused for example by a flow or creep effect on the part of the plastic material of the housing. Likewise, a loss of contact pressure may occur as a result of mechanical tolerances in regard to the non-flexible intermediate portions of the pressing arrangement.

DE 29 42 401 A1 discloses a semiconductor component with a pressing arrangement which has at least one assembly element which is stable in respect of shape and in relation to heat, in the form of a yoke arrangement, and a plate spring constituting an elastically yielding pressing means disposed on the inward side of the mounting element which is towards the cooling member which in turn is in the form of a trough-shaped element. The pressing means presses against the at least one component to be cooled and/or against the at least one mounting plate, in electrically insulated relationship, in the vicinity of the at least one component to be cooled. The use of a plate spring as part of the yielding pressure means provides that the contact pressure can be suitably set and kept at a substantially constant value.

JP 1 310 566 A (Patent Abstracts of Japan, E-879, 1990, Vol 14, No 112) discloses a semiconductor device with a yielding pressing means in the form of a spring disposed between a semiconductor chip and a cap.

JP 63-226952 A (Patent Abstracts of Japan, E-705, 1989, Vol 13, No 23) discloses a semiconductor device with a yielding pressing means in the form of a spring, wherein the spring does not press directly on to a semiconductor chip but presses against the semiconductor chip indirectly by way of an insulating material which covers the semiconductor chip.

DE 36 28 556 C1 describes a circuit or semiconductor arrangement in which at least one chip-form component to be cooled is disposed on a mounting plate and encapsulated in an insulating material. Current conductor portions of the chip-form component to be cooled are arranged at least at a number of locations as contact portions for pressure contacting purposes. The current conductor portions project from the encapsulation of insulating material, on the side of the component which is remote from the mounting plate. That circuit arrangement has a cooling member and a contact plate, with the contact portions being disposed on the mounting plate separately from the component to be cooled. Pressure contacting in respect of the contact portions occurs outside the insulating encapsulation and the contact plate is common to all the contact portions.

A power semiconductor module comprising a mounting plate which is metallised on both sides and which on the top side is fitted with components, fitted into a plastic housing and covered with casting material, is disclosed in DE 35 21 572 A1. In the module, at least one support is disposed on the mounting member or a component, an elastomeric casting is provided as a first soft casting material, with an upper portion of the support or supports projecting therefrom, while a thermosetting casting is provided as a second hard casting material, for covering the upper portion of the at least one support and connecting it to the housing.

SUMMARY OF THE INVENTION

An object of the present invention is that of providing a circuit arrangement with a mounting plate pressed against a cooling member, which ensures an at least substantially constant contact pressure therebetween even when the arrangement is subjected to mechanical and thermal loadings which fluctuate in respect of time.

Another object of the present invention is to provide a circuit arrangement including a cooling member against which is pressed a mounting plate carrying a chip component to be cooled, which permits simple mechanical assembly of the circuit arrangement and which is simple to manufacture.

Still another object of the present invention is to provide a circuit arrangement having a mounting plate carrying at least one chip-form component and a cooling member against which the mounting plate is pressed, which can be of a small compact design involving simplicity of structure as well as constancy of performance.

In accordance with the principles of the present invention the foregoing and other objects are achieved by a circuit arrangement comprising at least one mounting plate on which are disposed at least one chip-form component such as a semiconductor component, which is to be cooled, and contact surfaces or lands. The or each chip-form component is electrically conductively connected to associated contact surface by means of suitable connecting elements. The arrangement further includes a cooling member on which the at least one mounting plate is disposed, and a pressing arrangement for pressing the mounting plate against the cooling member. The pressing arrangement includes at least one mounting element which is stable in respect of heat and shape, and a pressing means including a cushion or pad element of an electrically insulating, elastically yielding material on the side of the mounting element which is towards the cooling member and adapted to press against the at least one chip-form component and/or in the vicinity thereof against the at least one mounting plate in electrically insulated relationship therewith.

By virtue of the presence of the mounting element which is stable in respect of heat and shape, the circuit arrangement according to the invention has the advantage that yielding or flow on the part of the material of the mounting element is at least substantially eliminated, even when the arrangement is subjected to mechanical and/or thermal loadings which act for a prolonged period of time and/or which fluctuate, so that the contact pressure of the pressing arrangement against the at least one chip-form component to be cooled and/or against the at least one mounting plate remains reliably maintained and constant at all times. Preferably the mounting element comprises metal or plastic material which is stable in respect of shape. The mounting element and the cooling member may be of a simple flat-surfaced plate-like configuration, but it is also possible for example for the cooling member to be in the form of a cooling body which has a cooling rib structure. It will be appreciated that the mounting element may also be provided with cooling ribs in a corresponding fashion in order to ensure cooling of the mounting plate at both sides, so that the cooling effect is still further enhanced. Overall, in accordance with the invention, a circuit arrangement can be produced of relatively small volume and with a high level of power density.

In a preferred feature of the circuit arrangement according to the invention the pressing means may include at least one spring element. The or each spring element may be for example a coil spring. In order reliably to avoid insulation problems with a circuit arrangement of that configuration, the or each spring element may have electrical insulation at least at its end portion which is remote from the mounting element. The insulation may be of any suitable shape, for example in the form of a tablet, a disc, a cap or like member which is suitably disposed on the spring.

The cushion element, at its side remote from the mounting element, preferably has recess means and projecting portions, in an at least approximate adaptation to the profiling of the at least one mounting plate. In a circuit arrangement of that configuration, it may have a recess or recesses for fixing and adjustment of a mounting plate or mounting plates relative to each other or relative to the cooling member. Likewise, in a circuit arrangement of that kind, recesses may be provided for fixing and adjustment of rigid releasable connecting elements, relative to the at least one mounting plate. The projecting portions in such a circuit arrangement may press directly against the at least one mounting plate or against the at least one component disposed on the corresponding mounting plate.

The circuit arrangement according to the invention also enjoys the particular advantages that it is very simple to assemble and repair because it is readily possible for a defective mounting plate to be replaced by an unworn new or operational mounting plate, whereupon the pressing arrangement can be fixed again to the cooling member. That can be effected for example by screw and/or clamping connections. It may be advantageous for the mounting element of the pressing arrangement to be connected to the cooling member by means of sprung connecting elements such as spring discs or the like, so that it is possible to compensate for any yielding effect as between those members.

In a preferred feature of the invention, at least one said projecting portion is in the form of a sealing bead or ridge which is closed in itself, being therefore for example of an annular configuration, thereby to provide a circuit arrangement which is reliably protected from external influences. In that way individual components or individual mounting plates or the entire circuit arrangement can be sealed off and suitably protected.

In order to provide a reliable contact pressure force with which the at least one mounting plate is pressed against the cooling member, in order to ensure good thermal contact over a large area from the mounting plate to the cooling member, a preferred feature of the invention provides that the mounting element, on its side towards the cooling member, is of a profile configuration which is at least approximately adapted to the profile configuration of the at least one cushion element.

In another preferred feature of the circuit arrangement according to the invention the at least one chip-form component to be cooled, which is disposed on the mounting plate, is completely covered by a soft casting material which may be for example a silicone rubber material.

In another preferred feature of the invention, the or each cushion element may be defined at least at one side by at least one associated bridge element comprising a material which is stable in respect of heat and shape, the bridge element pressing by means of raised portions against the at least one chip-form component to be cooled and/or against the at least one mounting plate, and fixing same in position. That configuration ensures that at any time there is a given pressure applied against the mounting plate or the cooling member, even under high operating temperatures.

By virtue of the provision of the at least one bridge element, the parts of the cushion element which comprise elastic material and which press against the corresponding elements or parts of the circuit arrangement, are thermally insulated therefrom and mechanically limited, so that plastic deformation of the material of the cushion element, which may occur for example due to the effect of temperature, does not result in a reduction in the predetermined contact pressure.

Furthermore, by virtue of the bridge element being of a suitable configuration, adapted to the profiling of the elements and/or parts of the circuit arrangement which are to be subjected to the pressing effect, the contact pressure applied thereto can be such as to ensure good thermal contact and good mechanical fixing of the parts of the arrangement relative to the cooling member. Furthermore the at least one bridge element can be of such a configuration that it adjusts and fixes the parts of the circuit arrangement relative to each other. In a preferred feature of that configuration the or each bridge element may comprise electrically insulating material, while if at least some of the bridge elements comprise electrically conductive material, it is then also possible to provide electrical connections between the parts of the circuitry.

The bridge elements may be mutually independent separate elements, whereby it is possible to achieve excellent adaptation in respect of shape to the parameters of the circuit arrangement. However, bridge elements which are in the form of mutually independent separate elements involve a certain amount of assembly expenditure in terms of manufacture of the circuit arrangement, and for that reason it may be desirable for the bridge elements to be connected together to provide a unit. In that assembly, the bridge elements may represent effectively a rigid structure or they may be connected together by means of flexible connecting members in order thereby to assure good adaptation to the parameters of the corresponding circuit arrangement. The same purpose is served if the at least one bridge element, at its side towards the cooling member, has a surface contour which is adapted to the profiling of the circuit arrangement.

Further objects, features and advantages of the present invention will be apparent from the following description of preferred embodiments.

DESCRIPTION OF PREFERRED EMBODIMENTS

Figure 1:
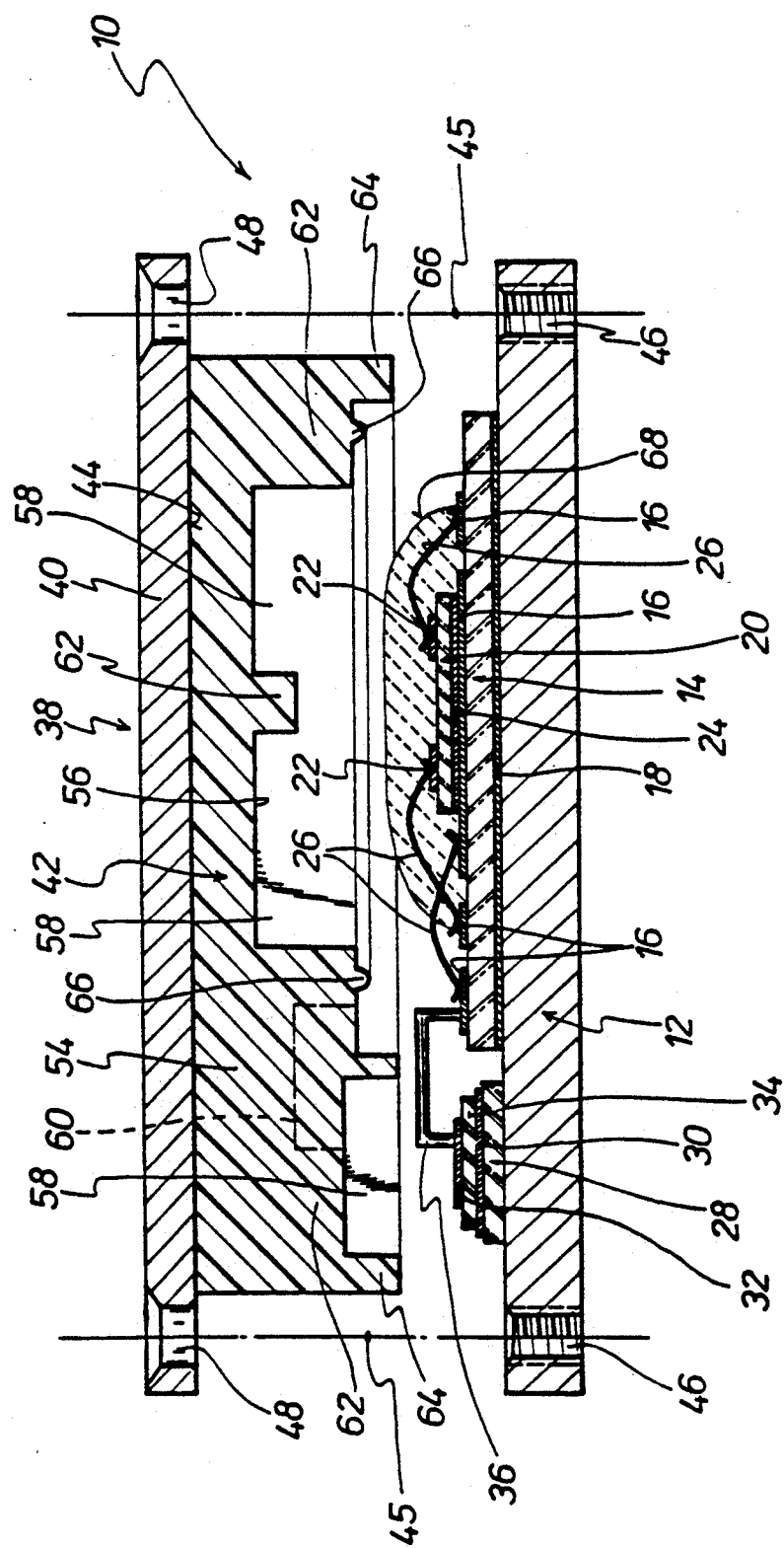
FIG. 1 is a view in section through a first embodiment of the circuit arrangement according to the invention.

Referring firstly to FIG. 1, shown therein is a sectional view of a circuit arrangement 10 according to the invention, with a cooling member indicated generally at 12. In the FIG. 1 embodiment the cooling member 12 is in the form of a simple plate.

Disposed on the cooling member 12 is a mounting plate generally indicated at 14, which is provided with contact surfaces or lands 16. On the underside which is remote from the contact surfaces 16, the mounting plate 14 is provided with a metal layer 18 in order to ensure good thermal conduction between the mounting plate 14 and the cooling member 12.

A chip-form component 20 which has contacts 22 and 24 is disposed on the mounting plate 14. The contact 24 is connected to an associated contact surface 16 on the mounting plate 14 while the contacts 22 of the chip-form component 20 are electrically conductively connected by means of flexible connecting elements 26, for example by means of bond wires, to associated contact surfaces 16 on the mounting plate 14.

Shown separately from the mounting plate 14 on the cooling member 12 is a substrate 28 having connections 30 and 32 which are electrically insulated from each other by means of an insulation indicated at 34. A rigid connecting element 36 of loop-like shape is provided to make an electrically conductive connection between the corresponding contact surface 16 on the mounting plate 14 and the corresponding connection 32 on the substrate 28.

The circuit arrangement 10 has a pressing arrangement 38 comprising a mounting element 40 and a pressing means 42. The pressing means 42 is disposed at the side 44 of the mounting element 40, the side 44 thus forming the underside in FIG. 1 and constituting an inward side insofar as it faces towards the cooling member 12. The mounting element 40 comprises for example metal and is thus stable in respect of shape and in relation to heat.

The cooling member 12 and the mounting element 40 are mechanically connected together, as is indicated in FIG. 1 by the thin dash-dotted lines 45 between the axially aligned through holes 46 and 48. The mechanical connection may be made by spring elements (not shown) which maintain a given contact pressure. The spring elements may be for example per se known spring discs or the like.

FIG. 1 shows the circuit arrangement 10 in the condition in which it has not been assembled, illustrating more clearly that the pressing arrangement 38 or more specifically the pressing means 42 thereof has a cushion or pad element 54 comprising an electrically insulating, elastically yielding material. At its side 56 which is remote from the mounting element 40 and which faces downwardly in FIG. 1, the cushion element 54 is provided with recesses 58, 60 and projecting or raised portions 62 and 64, in at least approximate adaptation to the profiling in respect of height of the mounting plate 14, the chip-form component 20 disposed thereon, and the rigid connecting elements 36 between the mounting plate 14 and the substrate 28. The recesses 58 defined by the recess configuration towards the right-hand end of the cushion element 54 serve in particular for adjustment of the mounting plate 14 relative to the cooling member 12 while the or each recess 60 serves for adjustment of an associated rigid connecting element 36. Therefore, the pressing arrangement 38 not only fixes the mounting plate 14 with the chip-form component 20 and the substrate 28 with the connections 30 and 32 accurately in position on the cooling member 12, but at the same time, with the rigid connecting elements 36, it is involved in the appropriate electrically conductive contact between contact surfaces 16 on the mounting plate 14 and for example the connection 32 on the substrate 28.

The projecting portions 62 of the cushion element 54 serve to press the mounting plate 14 against the cooling member 12, either directly or by way of the chip-form component 20. Reference numeral 66 generally identifies a projecting portion which is closed in itself in such a way as to extend around the recesses 58 operatively associated with the mounting plate 14, with the projecting portion 66 being in the form of a sealing bead or ridge to provide a sealing action in relation to external influences, while reference numeral 64 identifies an outer sealing bead or ridge portion extending around the elements disposed on the cooling member 12. A soft casting material 68 such as for example silicone rubber completely covers the chip-form component 20 which is fixed on to the mounting plate 14.

Figure 2:
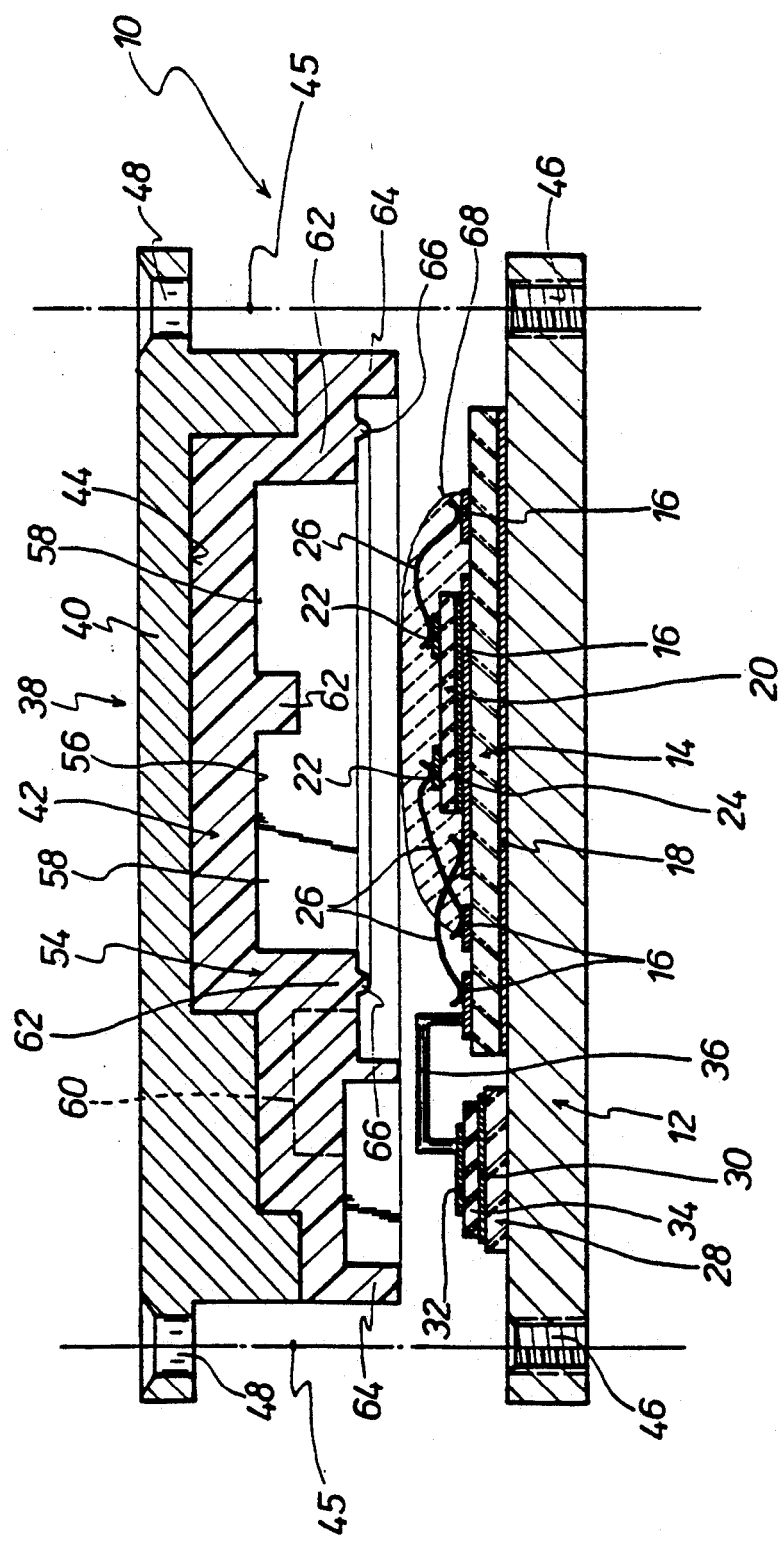
FIG. 2 is a view corresponding to that shown in FIG. 1 in section through a second embodiment of the circuit arrangement according to the invention.

FIG. 1 shows in an open condition a circuit arrangement 10 in which the mounting element 40 of the pressing arrangement 38 is in the form of a flat plate. In comparison therewith, shown in FIG. 2 is an embodiment of the circuit arrangement 10 according to the invention, in which the mounting element 40 has, on its inward side 44 which faces towards the cooling member 12, a profiling configuration which is at least approximately adapted to the profiling as indicated at 56 of the cushion element 54 of the pressing arrangement 38. In other respects the circuit arrangement 10 shown in FIG. 2 is similar to the embodiment of the circuit arrangement 10 shown in FIG. 1, so that there is no need for all the details of the circuit arrangement 10 shown in FIG. 2 to be described again at this point. It will be noted that components and parts in FIG. 2 which are the same as those in FIG. 1 are identified by the same reference numerals.

Figure 3:
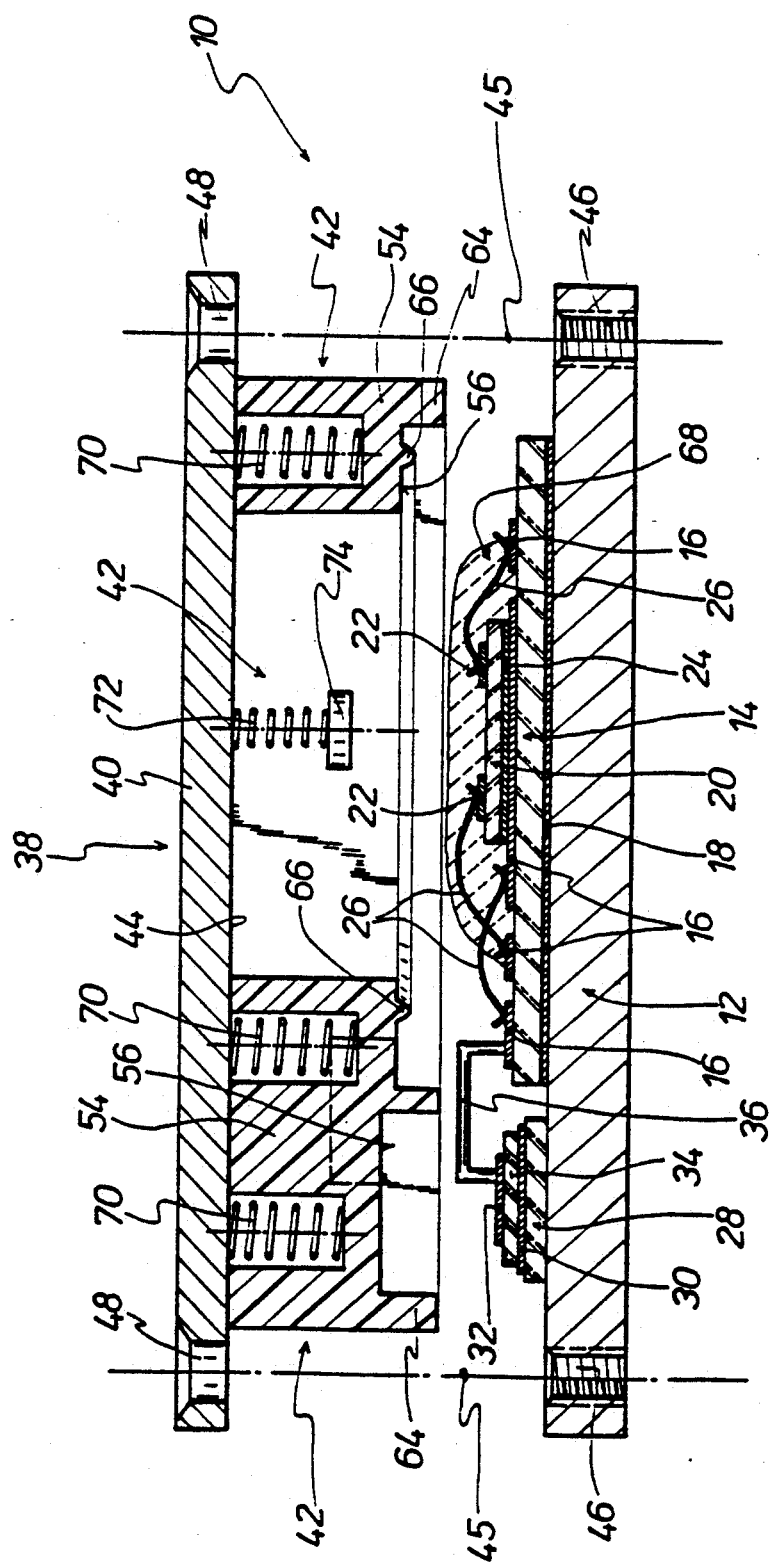
FIG. 3 is a view corresponding to those shown in FIGS. 1 and 2 in section through a third embodiment of the circuit arrangement according to the invention.

Reference will now be made to FIG. 3 showing a third embodiment of the circuit arrangement 10 according to the invention, which differs from the circuit arrangements shown in FIGS. 1 and 2 more especially in that the pressing means 42 of the pressing arrangement 38 has spring elements 70 and 72. The spring elements 70 are combined with a cushion or pad element 54 while the spring element 72 is combined with an electrical insulation 74 at its end remote from the mounting element 40, in the form of a disc, cap or like portion. The spring elements 70 and 72 are fixed to the inward or downwardly facing side 44 of the mounting element 40. In a similar fashion, the cushion element 54 is also fixed to the side 44 of the mounting element 40.

In other respects the circuit arrangement 10 shown in FIG. 3 is similar to the circuit arrangements shown in FIGS. 1 and 2 so that there is no need for a further detailed description of all the specific components and parts of the circuit arrangement which are identified in FIG. 3 by the same reference numerals as those used in FIGS. 1 and 2.

Figure 4:
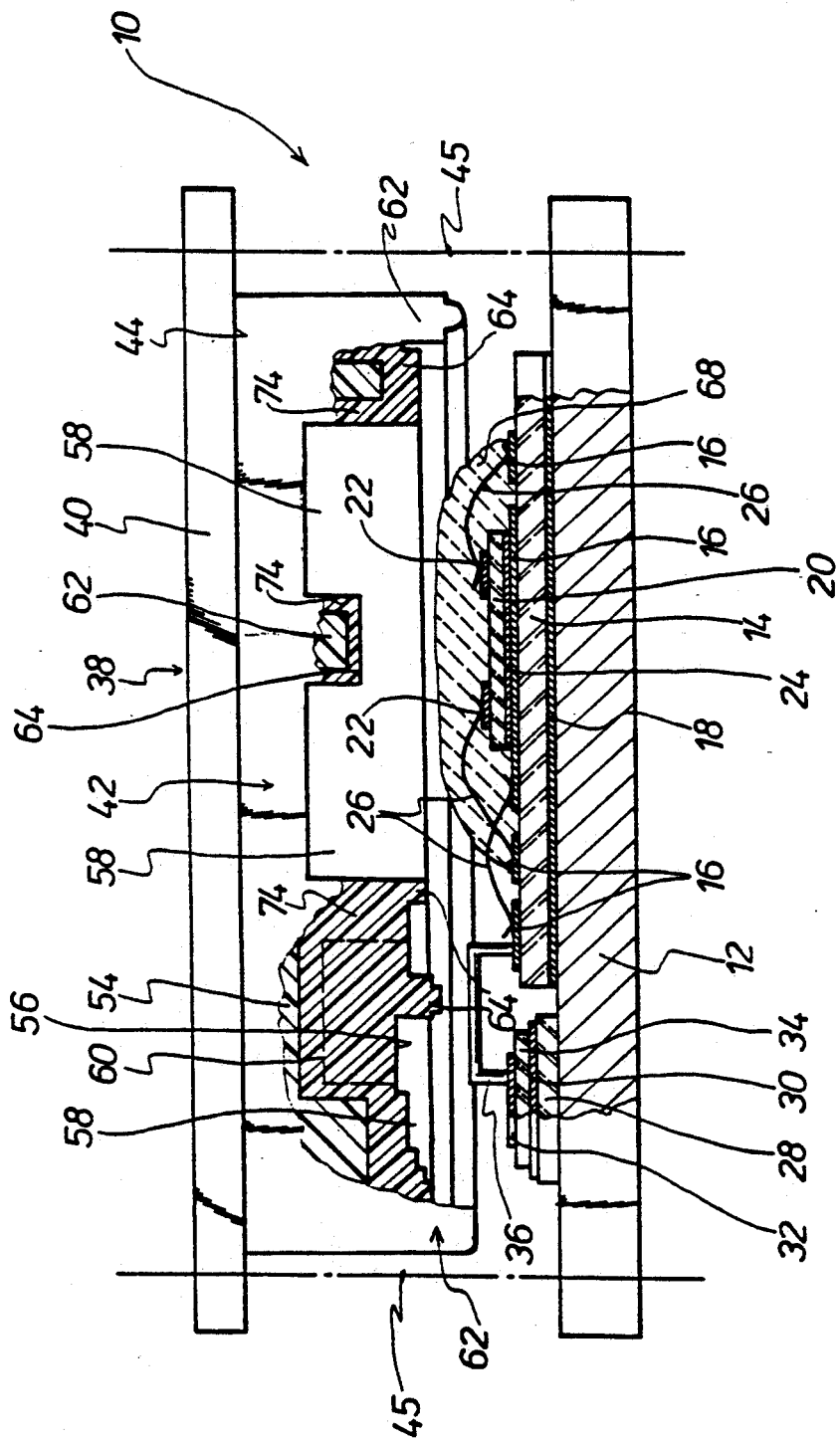
FIG. 4 is a partly sectional view of a fourth embodiment of the circuit arrangement according to the invention.

FIG. 4 is a partly sectional view on an enlarged scale of a circuit arrangement 10 according to the invention with a cooling member 12. The cooling member 12 is in the form of a flat metal plate but it will be appreciated that it would also be possible for the cooling member 12 to be provided with one or more cooling ribs. Arranged on the cooling member 12 is a mounting plate 14 of electrically insulating material which has contact surfaces or lands 16 which are disposed at spacings from each other on the top side of the mounting plate 14. On the underside of the mounting plate 14, which is remote from the contact surfaces 16, the mounting plate 14 has a metal layer 18 in order to ensure good thermal conduction between the mounting plate 14 and the cooling member 12.

Disposed on the mounting plate 14 is a chip-form component 20 which is more particularly a semiconductor component. The chip-form component 20 has contacts 22 and 24. The contact 24 is contacted with associated contact surface 16 of the mounting plate 14 while the contacts 22 on the top side of the chip-form component 20 are electrically conductively connected to associated contact surfaces 16 of the mounting plate 14, by means of flexible connecting elements 26. The flexible connecting elements 26 are for example bond wires.

Arranged on the cooling member 12 in spatially separated relationship from the mounting plate 14 is a substrate 28 which has connections 30 and 32 which are electrically insulated from each other by means of insulation as indicated at 34. A rigid connecting element 36 serves to make an electrically conductive connection between the corresponding contact surface 16 on the mounting plate 14 and the associated connection 32 on the substrate 28. The rigid connecting element 36 is for example in the form of a contact loop member.

The circuit arrangement 10 further comprises a pressing arrangement 38 having a mounting element 40 and a pressing means 42. The mounting element 40 comprises for example metal and is in the form of a plate of sufficient gauge, in order to ensure that it has suitable stability in respect of shape. The pressing means 42 is disposed at the underside 44 of the mounting element 40, which is towards the cooling member 12.

The cooling member 12 and the mounting element 40 can be mechanically connected together, as indicated by the thin dash-dotted lines 45.

The pressing means 42 comprises a cushion or pad element 54 of an electrically insulating, elastically yielding material. So that the contact pressure of the pressing means 42 against the mounting plate 14 or the cooling member 12 does not decrease as a result of flow or creep of the cushion element 40 even at high operating or use temperatures of the circuit arrangement 10, the cushion element 54 is delimited or surrounded by an associated bridge element 74 at certain portions of the cushion element, which are formed by projecting or raised portions 62 and which are to press against the mounting plate 14 or the component 20 to be cooled. The bridge element 74 comprises a material which is stable in respect of heat and shape, in comparison with the material of the cushion element 54. The or each bridge element 74 may comprise an electrically insulating or an electrically conductive material. If the corresponding bridge element comprises electrically insulating material, that is preferably a plastic material which sets hard. The cushion element 54 may comprise for example a silicone rubber.

The or each bridge element 74 is preferably provided with recesses 58, 60 and projecting portions 64 at its underside 56 which is remote from the mounting element 40, in at least approximate adaptation to the profiling configuration in respect of height of the mounting plate 14, the chip-form component 20 disposed on the mounting plate 14, and the rigid connecting elements 36 between the mounting plate 14 and the substrate 28. The recesses 58 serve to receive and adjust the mounting plate 14 and the substrate 28 in relation to the cooling member 12, while the or each recess 60 serves to receive and adjust an associated rigid connecting element 36. Therefore, by means of the pressing arrangement 38, not only can the mounting plate 14 with the chip-form component 20 and the substrate 28 with the connections 30 and 32 be fixed in exactly the right position on the cooling member 12, but for example at the same time, with the rigid connecting elements 36, the corresponding electrically conductive contact can also be made between the contact surfaces 16 on the mounting plate 14 and for example the connection 32 on the substrate 28.

A soft casting material 68 such as for example silicone rubber covers over the chip-form component 20 which is disposed on the mounting plate 14.

It will be appreciated that the above-described embodiments have been set forth solely by way of example and illustration of the principles of the present invention and that various other modifications and alterations may be made therein without thereby departing from the spirit and scope of the invention.

What is claimed is:

1. A circuit arrangement comprising at least one mounting plate, at least one chip-form component to be cooled, which is disposed on the mounting plate, contact surface means on the mounting plate, connecting means electrically conductively connecting the chip-form component to associated contact surface means, a cooling member on which the at least one mounting plate is arranged, and a pressing arrangement adapted to press the at least one mounting plate against the cooling member, the pressing arrangement including at least one mounting element which is stable in respect of heat and shape and a pressing means comprising a cushion element of electrically insulating, elastically yielding material on the side of the mounting element which is towards the cooling member and adapted to press against at least one of the chip-form component and the mounting plate in electrically insulated relationship in the vicinity thereof, further including at least one bridge element associated with the cushion element to delimit same at least at one side, the bridge element comprising a material which is stable in respect of heat and shape.

2. A circuit arrangement as set forth in claim 1 wherein the pressing means includes at least one spring element, the at least one spring element having an end portion which is remote from the mounting element and having electrical insulation means at least at its said end portion.

3. A circuit arrangement as set forth in claim 1 wherein at a side thereof remote from the mounting element the cushion element has recess means and projecting means in at least approximate adaptation to the profiling of the at least one mounting plate, the chip-form component and the connecting means on the cooling member.

4. A circuit arrangement as set forth in claim 3 wherein at least one said recess means is provided for adjustment of the mounting plate relative to the cooling member.

5. A circuit arrangement as set forth in claim 4 and including at least one rigid releasable connecting element, and further recess means for the adjustment and fixing of said rigid releasable connecting element.

6. A circuit arrangement as set forth in claim 3 wherein the cushion element has at least one said projecting portion for directly pressing the mounting plate against the cooling member.

7. A circuit arrangement as set forth in claim 3 wherein the cushion element has at least one said projecting portion for pressing the mounting plate against the cooling member by way of the chip-form component disposed on the mounting plate.

8. A circuit arrangement as set forth in claim 3 wherein at least one said projecting portion is in the form of a sealing ridge which is closed in itself.

9. A circuit arrangement as set forth in claim 3 wherein said mounting element has on its side which is towards the cooling member a profile configuration which is at least approximately adapted to the profiling of the at least one cushion element.

10. A circuit arrangement as set forth in claim 1 wherein the at least one chip-form component is completely covered by a soft casting material.

11. A circuit arrangement as set forth in claim 1 including means for mechanically connecting the mounting element to the cooling member, the connecting means including at least one spring means.

12. A circuit arrangement as set forth in claim 1 wherein said cushion element has projecting portions operable to press against the chip-form component.

13. A circuit arrangement as set forth in claim 1 wherein said cushion element has projecting portions operable to press against the mounting plate.

14. A circuit arrangement as set forth in claim 1 and further including a substrate having connection portions and disposed on said cooling member, wherein said at least one bridge element is operable to press against said substrate.

15. A circuit arrangement as set forth in claim 1 and further including a substrate disposed on the cooling member, and at least one connecting element connecting the substrate to the mounting plate, wherein the at least one bridge element is operable to press against the at least one connecting element.

16. A circuit arrangement as set forth in claim 1 wherein said at least one bridge element comprises an electrically insulating material.

17. A circuit arrangement as set forth in claim 1 and comprising a plurality of said bridge elements, wherein at least some of the bridge elements comprise an electrically conductive material.

18. A circuit arrangement as set forth in claim 1 and comprising a plurality of said bridge elements, wherein the bridge elements are in the form of mutually independent separate elements.

19. A circuit arrangement as set forth in claim 1 and comprising a plurality of said bridge elements, and flexibly yielding connecting means interconnecting at least some of said bridge elements to constitute a bridge element unit.

20. A circuit arrangement as set forth in claim 1 and comprising a plurality of bridge elements, at least one of the bridge elements being formed at its side towards the cooling member with a surface contour which is at least substantially adapted to the profiling of the mounting plate, the chip-form component and the connecting means.

21. A circuit arrangement as set forth in claim 20 wherein said at least one bridge element has recess means and projecting portions.

22. A circuit arrangement comprising at least one mounting plate, at least one chip-form component to be cooled, which is disposed on the mounting plate, contact surface means on the mounting plate, connecting means electrically conductively connecting the chip-form component to associated contact surface means, a cooling member on which the at least one mounting plate is arranged, and a pressing arrangement adapted to press the at least one mounting plate against the cooling member, the pressing arrangement including at least one mounting element which is stable in respect of heat and shape and a pressing means comprising a cushion element of electrically insulating, elastically yielding material on the side of the mounting element which is towards the cooling member and adapted to press against at least one of the chip-form component and the mounting plate in electrically insulated relationship in the vicinity thereof, further including at least one bridge element associated with the cushion element to delimit same at least at one side, the bridge element comprising a material which is stable in respect of heat and shape, a substrate disposed on the cooling member, and at least one connecting element connecting the substrate to the mounting plate, wherein the at least one bridge element is operable to press against the at least one connecting element.

* * * * *